United States Patent [19]

Gielis et al.

[11] Patent Number: 4,884,230
[45] Date of Patent: Nov. 28, 1989

[54] DIGITAL LATTICE FILTER

[75] Inventors: Gerardus C. M. Gielis; Antonius J. P. Bogers; Steven J. W. Van Lerberghe, all of Eindhoven, Netherlands

[73] Assignee: U.S. Philips Corporation, New York, N.Y.

[21] Appl. No.: 209,448

[22] Filed: May 4, 1988

[51] Int. Cl.[4] ............................................. G06F 15/31
[52] U.S. Cl. .................... 364/724.15; 381/51
[58] Field of Search ...................... 364/724.15, 724.17; 381/51

[56] References Cited

U.S. PATENT DOCUMENTS

| | | | |
|---|---|---|---|
| 4,209,844 | 6/1980 | Brantingham et al. | 364/724.15 |
| 4,398,262 | 8/1983 | Williams | 364/724.15 X |
| 4,554,858 | 11/1985 | Wachi et al. | 364/724.15 X |
| 4,695,970 | 9/1987 | Renner et al. | 364/724.15 |

OTHER PUBLICATIONS

Kimura, "Generalized Schwarz Form and Lattice-Ladder Realizations of Digital Filters", IEEE Trans. on Circuits & Systems, vol. CAS-32, No. 11, Nov. 1985, pp. 1130–1139.

Gray et al., "Digital Lattice and Ladder Filter Synthesis", IEEE Trans. on Audio and Electroacoustics, vol. AU-21, No. 6, Dec. 1973, pp. 491–500.

Primary Examiner—Gary V. Harkcom
Assistant Examiner—Tan V. Mai
Attorney, Agent, or Firm—Algy Tamoshunas; Marianne R. Rich

[57] ABSTRACT

A digital lattice filter, comprising a plurality of identical stages each having a pair of inputs for receiving input signals and a pair of outputs for supplying output signals, these stages being connected in a cascade arrangement, each stage consisting in two mutually linked branches and no less than one of these branches comprising delay means, and in that always an even number of successive cascaded filter stages forms a group, in which both branches of each group of filter stages comprise a delay elements such that the time delay in the first branch is equal to the time delay in the second branch.

9 Claims, 13 Drawing Sheets

| klok ↓ | buffer → | | | | | | | | | | | | | |
|---|---|---|---|---|---|---|---|---|---|---|---|---|---|---|
| | 20 | 28 | 21 | 22 | 29 | 23 | 24 | 26 | 25 | 27 | 32 | 33 | 34 | 30 | 31 |
| 1 | 1 | 0 | 0 | 0 | 0 | 1 | 1 | 0 | 0 | 0 | 1 | 1 | 1 | 0 | 0 |
| 2 | 0 | 0 | 0 | 0 | 0 | 0 | 0 | 0 | 0 | 0 | 0 | 0 | 0 | 0 | 0 |
| 3 | 0 | 1 | 0 | 0 | 0 | 0 | 0 | 1 | 0 | 0 | 0 | 1 | 1 | 1 | 0 |
| 4 | 0 | 0 | 0 | 0 | 1 | 0 | 0 | 0 | 0 | 0 | 1 | 0 | 1 | 0 | 1 |
| 5 | 0 | 0 | 0 | 0 | 0 | 0 | 0 | 0 | 0 | 0 | 0 | 0 | 0 | 0 | 0 |
| 6 | 0 | 0 | 0 | 1 | 0 | 0 | 0 | 0 | 0 | 0 | 1 | 0 | 1 | 0 | 1 |
| 7 | 0 | 1 | 0 | 0 | 0 | 1 | 0 | 0 | 1 | 0 | 1 | 1 | 1 | 0 | 0 |
| 8 | 0 | 0 | 0 | 0 | 0 | 0 | 0 | 0 | 0 | 0 | 1 | 0 | 0 | 0 | 0 |
| 9 | 0 | 0 | 1 | 0 | 0 | 0 | 0 | 0 | 0 | 1 | 1 | 1 | 1 | 1 | 0 |
| 10 | 0 | 0 | 0 | 1 | 0 | 1 | 0 | 0 | 0 | 0 | 1 | 0 | 1 | 0 | 1 |
| 11 | 0 | 0 | 0 | 0 | 0 | 0 | 0 | 0 | 0 | 0 | 1 | 0 | 0 | 0 | 0 |
| 12 | 0 | 0 | 0 | 0 | 1 | 0 | 0 | 0 | 0 | 0 | 1 | 0 | 1 | 0 | 1 |

DIGITAL LATTICE FILTER

BACKGROUND OF THE INVENTION

1. Field of the Invention

The invention relates to the field of digital filters and more particularly to a digital lattice filter, comprising a plurality of identical stages.

2. Description of the Prior Art

Cascade connected stages in a digital lattice filter each have a pair of inputs for receiving input signals and a pair of outputs for supplying output signals, these stages being connected in a cascade arrangement, each stage consisting in no less than two mutually linked branches and no less than one of these branches comprising delay means, a digital lattice filter, comprising a plurality of identical stages each having a pair of inputs for receiving input signals and a pair of outputs for supplying output signals, these stages being connected in a cascade arrangement, each stage consisting in no less than two mutually linked branches, no less than one of these branches comprising delay means, a number of successive cascaded filter stages forming a group, both branches of each group of filter stages comprising delay means such that the time delay in the first branch is equal to the time delay in the second branch.

Such a lattice filter is known from the article entitled: "Generalized Schwarz Form and Lattice-Ladder Realizations of Digital Filters" by Hidenori Kimura, published in IEEE Transactions on Circuits and Systems, Vol. CAS-32, No. 11, November 1985, pp. 1130–1139, and especially from FIG. 8. It is a known fact, inter alia, from the article mentioned as a reference in the above article, entitled: "Digital Lattice and Ladder Filter Synthesis" by A. H. Gray and J. D. Markel, published in IEEE Transactions on Audio and Electroacoustics, Vol. AU21, No. 6, December 1973, pp. 491–500, that lattice filters have particularly favourable properties and are therefore utilized in a great number of applications, more specifically, in the field of speech processing, because a lattice filter permits a direct interpretation of a model of a speech path. Generally, a model composed of an all-pole acoustic filter is used for a speech path, which requires the use of an all-zero analysis filter. In the case of speech processing, in which the sampling rate of the signals to be processed by the filter is relatively low, the fact that the signals have to be processed sequentially by the successive stages of the lattice filter, so that during a single sample interval the number of calculations is at least equal to the number of filter stages, will not cause a problem to either the analysis lattice filter or the synthesis lattice filter.

However, it is also desirable to utilize lattice filters, more specifically, recursive lattice filters, in a large number of other cases. Recursive filters having a relatively short span can provide relatively long impulse responses, so that the number of calculations required can be less, which in many cases is highly attractive. A problem in respect of recursive filters and, more specifically, adaptive recursive filters is the fact that they can become unstable when a pole in the filter is outside the unit circle. Lattice filters not only have the advantage that smaller word lengths can be used, but also that the requirements as to stability can easily be verified on the basis of the values of the filter coefficients.

An all-pole recursive lattice filter, as is known from the above-mentioned article by Gray and Markel, is shown in FIG. 1. The filter can comprise a cascade arrangement of 2N stages, each stage consisting of two branches 1 and 2, which are mutually linked via connections in which multiplier circuits 3 and 4 are incorporated. In adder circuit 5 the input signal e(i)(n) of branch 1 is combined with the output signal of multiplier circuit 4, whose multiplication factor is $K^b(i)$, whilst in adder citcuit 6 the input signal of branch 2 is combined with the output signal of multiplier circuit 3, whose multiplication factor is $K^a(i)$. To the input of branch 2 a circuit of delay elements 7 is connected delaying the input signal d(i-1)(n) of branch 2 over one sample period.

For the output signal of branch 1 the following holds:

$$e(i-1)(n) = e(i)(n) + K^b(i) d(i-1)(n-1) \quad (1)$$

For the output signal of branch 2 the following holds:
$$d(i)(n) = K^a(i) e(i-1)(n) + d(i-1)(n-1) \quad (2)$$

The equations (1) and (2) show that for calculating d(i)(n), not only the values have to be known of d(i-1)(n-1) of the preceding stage, during the preceding sample period, but also the signal e(i-1)(n), for which the signal e(i)(n) of the preceding stage has to be known, that is during the same sample interval. This does not pose a problem as long as there is ample time for a specific sample to travel the filter from beginning to end during an interval between successive samplings. The equations (1) and (2) can then be calculated sequentially by a processing means starting with i=2N, where e(2N)(n) is equal to the actual signal sample x(n) at the input of the filter, and ending with i=1, where the signal sample y(n) is available at the filter output as the signal e(0)(n). Subsequently, the next signal sample x(n+1)=e(2N)(n+1) can be received, in which the calculated values of d(i)(n) have assumed the values of their predecessors.

It will be evident that all this imposes considerable restrictions on the implementation of a digital filter of some magnitude, realized an all-pole lattice filter. In a real-time system the fact that such an implementation is possible or impossible totally depends on the speed of the available processors. The fact that each stage requires at least one multiplication and one addition has rendered the processing of more than one stage between two system clock pulses problematic. The duration of the system clock pulses can be equal to the sample period, but is generally much shorter. Even if table look-up methods were used, 2N operations would have to be carried out in a single sample period, and the storage capacity required would be very considerable. The input signal for one stage requires two signal words (e(i)(n) and d(i-1)(n-1)) and one coefficient word (K(i)). They could be encoded into one address, which address would contain the stage output signal in a sufficient number of bits to encode the two signals e(i-1)(n) and d(i)(n). For 8-bit signals and 4-bit coefficients this would ask for a two megabyte memory, to be addressed 2N times per sample period.

Even with such a table look-up method the maximum span of a recursive lattice filter remains inversely proportional to the sampling rate. Thus, the maximum span of the filter is equal to the ratio between the sample period and the system clock-period. For a signal having a bandwidth of 25 kHz an all-pole lattice filter having a span of 20 stages, arranged in this idealized manner, would still require a system clock of approximately 1

MHz, the Nyquist frequency being 50 kHz. At present this is possible, true enough, but many systems require still much higher sampling rates, so that the limits of the existing, more specifically economically justifiable, hardware are reached. For example, if one wishes to construct an anti-multipath filter for an FM-receiver, when assuming the FM-signal to be transformed down to a zero-frequency carrier, the sampling rate for the FM-signal will be approximately 0.5 MHz. The minimum delay which the filter has to be able to cover is approximately 50 µs. Practice has shown that even in this simple example in excess of 20 stages have to be calculated sequentially during the interval between two incoming signal samples, that is to say within approximately 2 µs. Economically this is not feasible with the existing hardware.

The above article by Hidenori Kimura describes how a general formula can be drived for the matrix representation of a lattice filter. After deriving this matrix representation, called Generalized Schwarz Form in the article, it is shown that there are $2^{n-1}$ lattice realizations of a digital filter of the n order. In one of these realizations delay means have been incorporated in the two branches of the lattice filter so as to make the delay in the two branches the same. In the article it is stated that this reduces the length of the longest delay-free path in the filter and enables the process rate of the filter to increase, but it is not stated in any way how this could be realized and it does not contain any clue thereto either.

SUMMARY OF THE INVENTION

An object of the present invention is to provide a recursive lattice filter of the type mentioned above which is suitable for very high sampling rates and with which existing, low-cost hardware can be implemented in a simple manner.

Thereto the invention provides a lattice filter of the type mentioned above, each group comprising an even number of successive cascaded filter stages and each group comprising not more than one processing unit which calculates from the two input signals the two output signals of the group during a sample interval, whilst the processing units of the successive groups calculate the output signals for different sampling instants.

As will be explained hereinbelow in the description of the embodiments with reference to the drawings, it is possible due to this invention to process a recursive lattice filter having relatively slow and hence cost-effective processing units, in parallel, without affecting the properties of the lattice filter.

BRIEF DESCRIPTION OF THE DRAWINGS

FIG. 9b shows the signal flow in the filter as a function of place and time relating to the filter as shown in FIG. 9a.

DESCRIPTION OF THE PREFERRED EMBODIMENTS

Figure 1:
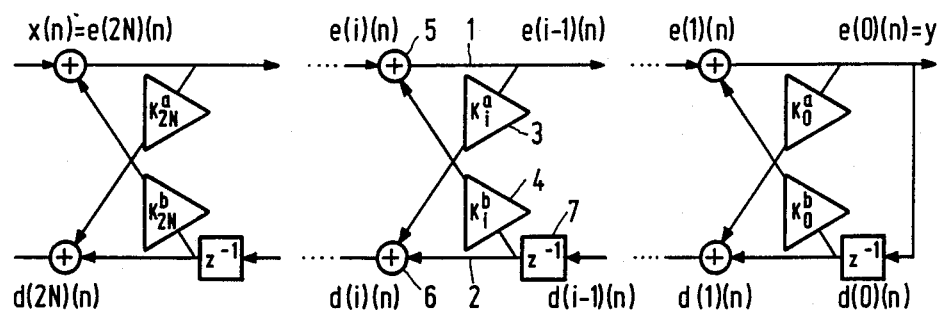
FIG. 1 shows a known configuration of a recursive lattice filter having 2N stages.

The lattice filter known per se and shown in FIG. 1 has already been explained above. When maintaining the same notation for the various signals in the filter, the signals e and d in the respective stages i+1, i; i−1 and i−2 at the instants n−1, n and n+1 can be represented in the manner shown in FIG. 2. The arrows in these Figures indicate which other signals a signal e or d depends on. As appears from the signal groups in broken line boxes shown in FIG. 2, the signal e(i−1)(n) depends on the signal e(i)(n) and the signal e(i−2)(n) depends on the signal e(i−1)(n). This implies that the signals e at the instant n always depend on the signals e of the preceding stage also at instant n. This has rendered a parallel calculation of a plurality of stages during one sample interval impossible.

Figure 3:
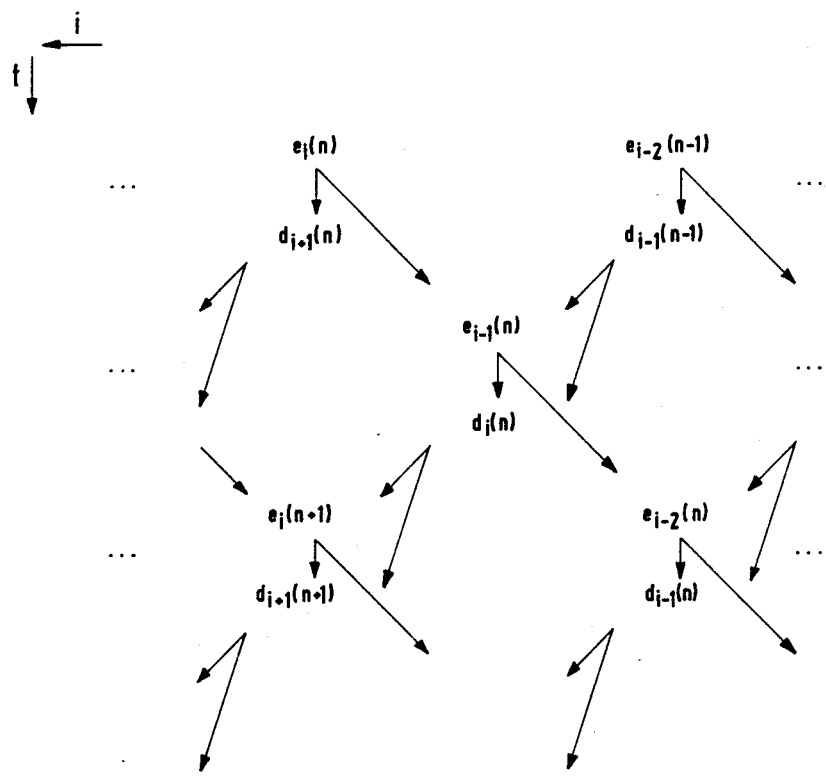
FIG. 3 shows another representation of the signal flow inside the filter shown in FIG. 1 as a function of place and time.

FIG. 3 shows another way of representing according to the invention the course of the signals e and d in the respective stages i, i−1 and i−2 at the instants n−1, n and n+1. When representing the signal flow in this manner, the values of e and d at the sampling instant n turn out to depend solely on the values of e and d at the instant n of the preceding stage in the lattice filter and after that on signals e and d which have been calculated at the instant n−1, which are already known and which can have been stored in a memory. The invention is based on the recognition that the signal values in a recursive lattice filter, which for example comprises 2N stages, can be calculated in parallel by providing N processing units, each successively calculating during a sample interval only the output signals of a first and a second stage of a pair of adjacent filter stages combined to a group. This implies that when the signals e(i)(n), e(i−1)(n); d(i−1)(n) and d(i)(n) are calculated at a specific instant, for the preceding stage pair the value is calculated at the sampling instant n+1 and for the next stage pair the value is calculated at the sampling instant n−1. The next pair of stages after all requires the calculations of the preceding pair of stages at the instant n as can be read from FIG. 3. This also means that for the filter according to the invention the output signals of the filter will be available after N sample periods. This is advantageous in that a parallel processing of pairs of filter stages is feasible at a considerably lower processing rate.

Figure 4:
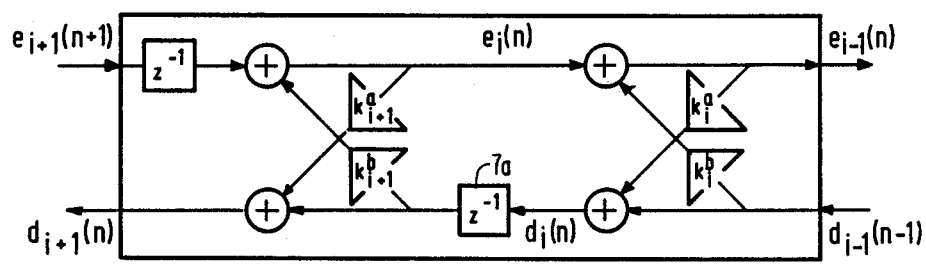
FIG. 4 shows a schematic diagram of an optional circuit implementation of the signal flow as shown in FIG. 3 in a group of filter stages of a lattice filter according to the invention.

FIG. 4 shows the way in which a pair of filter stages of the lattice filter represented in FIG. 1 can be grouped and modified for providing a lattice filter according to the invention which can be processed in parallel. Thereto, the delay stage 7 of a stage i is transferred to the input of branch 1 of stage i+1. It can be proved that the delay elements in the pairs of filter stages can be shifted in a lattice filter according to the invention without further affecting the properties of the lattice filter. A theory which can be utilized in this context is discussed in the article entitled "Realizability of Digital Filter Networks" by A. Fettweis in AEÜ, Volume 30, (1976) Book 2, pp. 90–96. A plurality of double filter stages of the form represented in FIG. 4 can again be combined into a lattice filter which has the same properties as the filter shown in FIG. 1, in which, however, between stage 2N and stage 1 of the complete filter, a delay occurs in the signal-processing of not more than N sample intervals, which delay in this case is distributed equally over all stages.

For the relationships between the in- and output signals of the filter as shown in FIG. 4 the following equations hold:

$$e(i)(n) = e(i+1)(n) + k^b(i+1)d(i)(n-1) \quad (3)$$

$$d(i+1)(n) = K^a(i+1)e(i)(n) + d(i)(n-1) \quad (4)$$

$$e(i-1)(n) = e(i)(n) + K^b(i)d(i-1)(n-1) \quad (5)$$

$$d(i)(n) = K^a(i)e(i-1)(n) + d(i-1)(n-1) \quad (6)$$

Hence it is proved that if the successive filter stages are synchronized properly, these equations can be effected cyclically, allowing the use of a multi-processor.

Figures 5, 6:
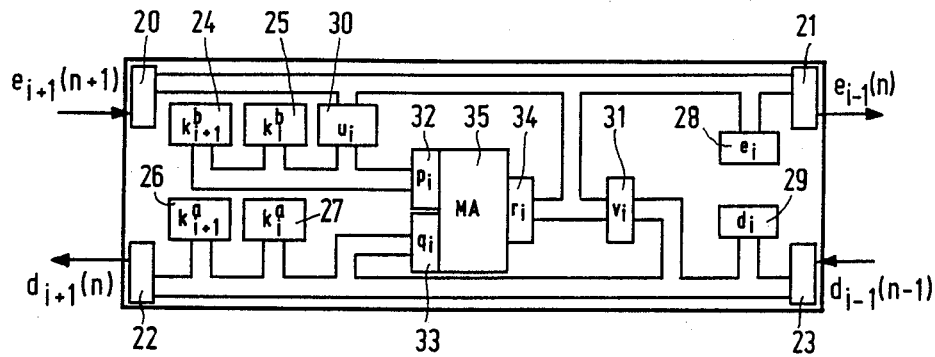
FIG. 5 shows an optional embodiment of a filter shown in FIG. 4 wholly realized in a processing unit.
FIG. 6 shows a logic table of the conditions in the processing unit as shown in FIG. 5 during a clock pulse cycle.

FIG. 5 shows in a simplified diagram the way in which the double filter stage shown in FIG. 4 could be realized as a processing unit with the aid of digital integrated circuits. The processing unit contains a plurality of buffer circuits 20 to 30 which can allow to pass (state 1) or block (state 0) a signal occurring in a respective buffer circuit under the control of clock pulses. The respective buffer circuits 20 to 23 contain the signals e(i)(n); e(i−1)(n); d(i)(n) and d(i−1)(n). The respective buffer circuits 24 to 27 contain the coefficients $K^b(i+1)$, $K^b(i)$, $K^a(i+1)$ and $K^a(i)$. The respective buffer circuits 28 and 29 contain the signals e(i) and d(i). The respective buffer circuits 30 and 31 have a switching function and their signal contents are indicated by u(i) and v(i) for clarity. The buffer circuits 32, 33 and 34 whose signal contents are indicated by p(i); q(i) and r(i) cooperate with a processor 35 MA, which, when calculating, produces a (new) output signal r(i), for which holds r(i)(new) = p(i).q(i) + r(i)(old). During a sampling interval 12 clock pulses occur providing the control of the buffer circuits according to FIG. 6, in order to have the output signals e(i−1)(n) and d(i+1)(n) satisfy the respective equations (4) and (5). FIG. 6 diagrammatically shows by means of a table containing ones and zeros the status of the various buffer circuits 20 to 34 during a sample interval. During the clock pulse period in which all buffer circuits are in the (0) state, circuit 35 effects a calculation.

Figure 7:
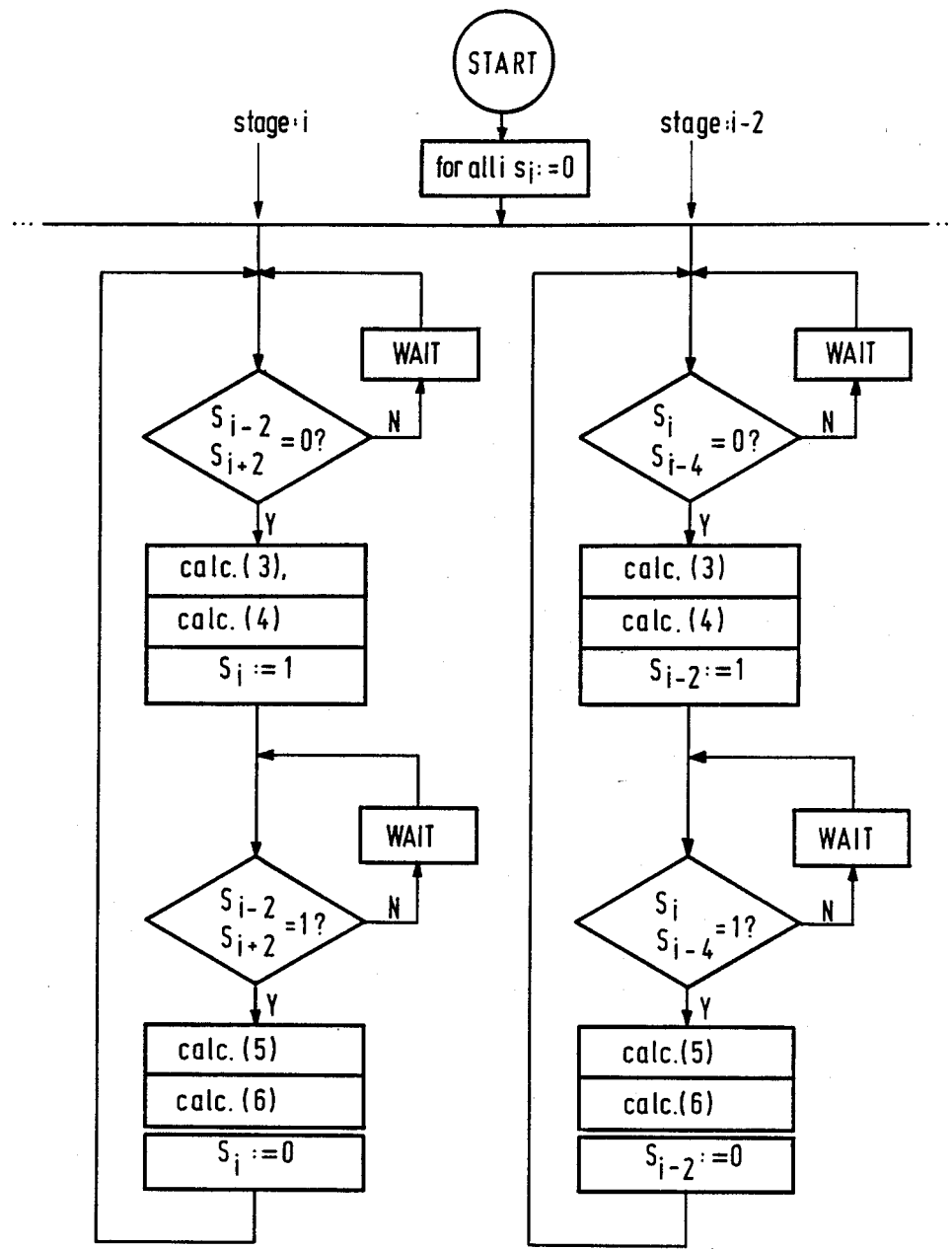
FIG. 7 shows a flow chart for two consecutive processing units as shown in FIG. 5.

FIG. 7 shows a flow chart indicating how two successive processing units as shown in FIG. 5 calculate the equations (3) to (6). For these calculations a status flag s(i) is utilized indicating what calculation is effected by stage i at a specific moment, that is to say s(i)=1 if stage i solves the equations (3) and (4) and s(i)=0 if the equations (5) and (6) are solved. This status flag is deemed desired in order to verify whether all adjacent processing units are busy calculating the same equations, so that synchronization between these stages is ensured. The notation of the stages in the flow chart of FIG. 5 is chosen such that the processing unit shown is denoted i and the adjacent processing units i+2 and i−2, respectively.

A number N of the processing units shown in FIG. 5 can be combined into a lattice filter having N processing units in which the output signal of the filter arrives at the output delayed over N sample intervals. It may be deemed desired not to provide one processor per processing unit, which comprises two conventional lattice filter stages in this embodiment of the invention, but two processors of a lower speed type. In that case the first processor is utilized for solving the equations (3) and (4) and the second processor for solving the equations (5) and (6). This is extremely advantageous when the sampling rate of the signal applied to the filter is so high that a single prior art processor cannot or can hardly cope with this. The use of two processors which operate at a slower speed, but which are considerably more cost-effective, and which are able indeed to solve two equations each in one sample interval, will then be advantageous.

FIGS. 8a–d show in simplified diagrams, omitting the signal paths already shown in FIG. 5, how such a processing unit comprising two processors could be constructed for a double filter stage. This processing unit basically consists of 18 buffer circuits 40–58, which can produce their signal contents at the command of a clock signal. The buffer circuits 40–43, respectively, contain the in and output signals of the double filter stage; the buffer circuits 44–47, respectively, contain the filter constants $K^a(i)$; $K^b(i)$; $K^a(i+1)$ and $K^b(i+1)$. The buffer circuits 48–51 are associated with the first processor 58 and the signals occurring therein are denoted A1, B1, C1 and R1, respectively. During a calculation operation this processor applies a signal to the buffer circuit 51 for which R1 = C1.D1 + A1.

The buffer circuits 52–55 are associated with the second processor 59 and the signals available there are denoted A2, B2, C2 and R2. After a calculation, processor 59 applies a signal to buffer 55 for which holds R2 = C2.B2 + A2.

In fact, the buffer circuits 56 and 57 are double buffer circuits, circuit 56 containing an old and a new value of the signal e(i) and circuit 57 an old and a new value of the signal d(i).

Hereinbelow it is shown schematically which calculations are made for the signal flows represented in FIGS. 8a–8d, the notation XY indicating that the signal in buffer Y is transferred to buffer X.

Figure 8A:
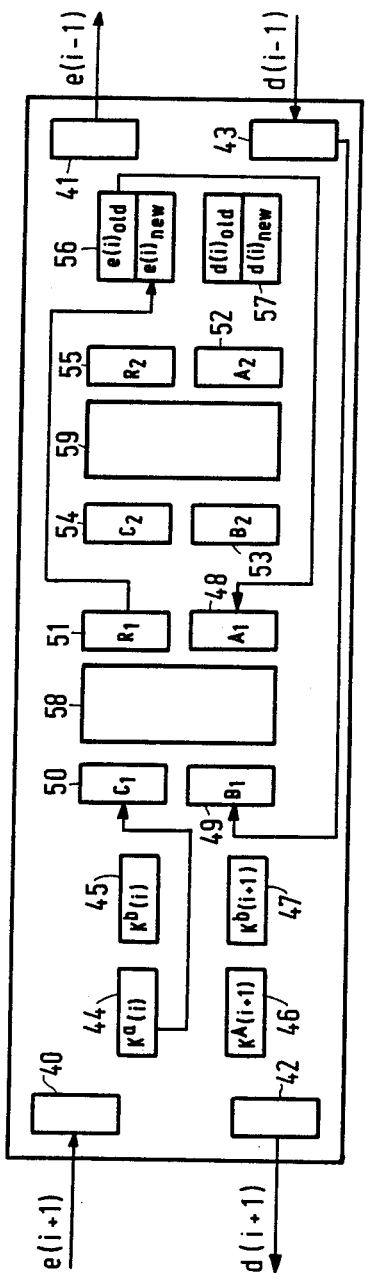
FIGS. 8a–d show four schematic diagrams of different embodiments of the processing unit shown in FIG. 5.

FIG. 8a: e(i)(new)←R$_1$; B$_1$←d(i−1); C$_1$←K$^a$(i); A$_1$e-(i)(old); calculate with 59 R$_1$=C$_1$B$_1$+A$_1$.

Figure 8B:
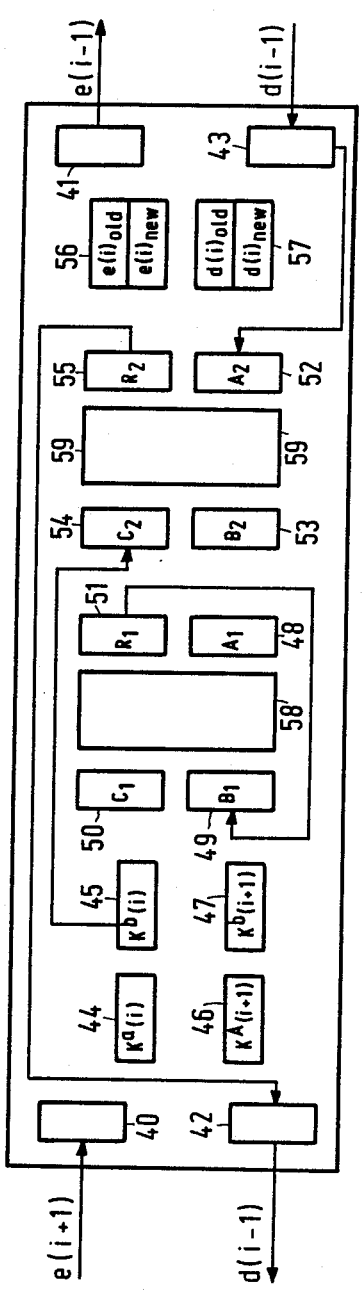
Figure 8C:
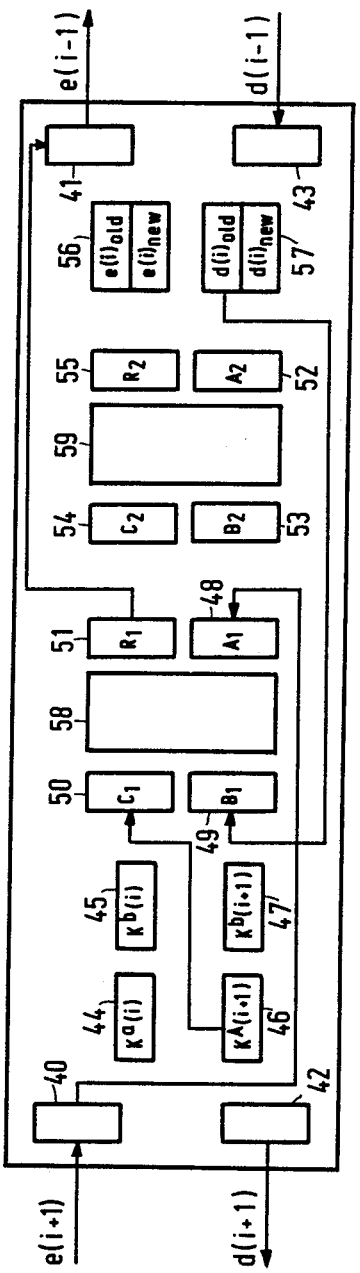
Figure 8D:
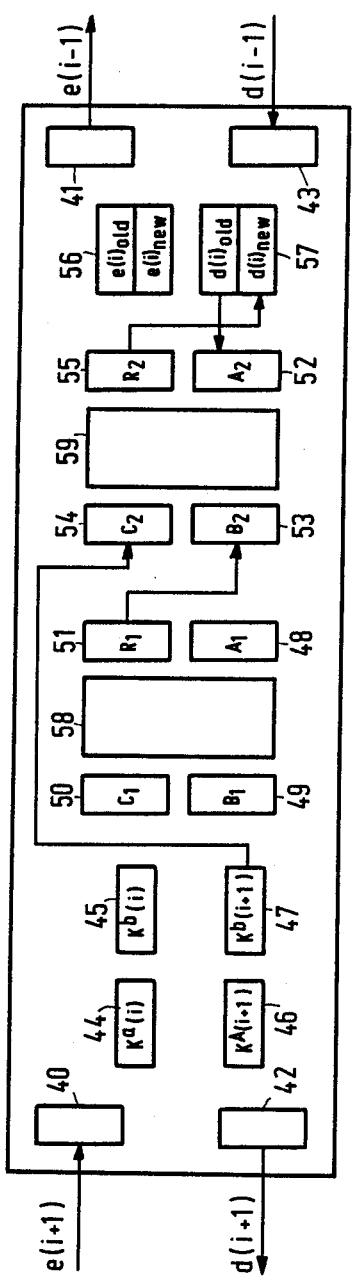

FIG. 8b: d(i+1)←R$_2$; B$_1$←R$_1$; C$_2$←K$^b$(i); A$_2$←d-(i−1); calculate with 60:R$_2$=C$_2$B$_2$+A$_2$ FIG. 8c: e(i−1)←R$_1$; B$_1$←d(i); C$_1$←K$^a$(i−1); A$_1$←e(i+1); calculate with 59: R$_1$=C$_1$B$_1$+A$_1$ FIG. 8d: d(i)(new)←R$_2$; B$_2$←R$_1$; C$_2$←K$^b$(i+1)←d(i)-(old); calculate with 60:R$_2$=B$_2$C$_2$+A$_2$.

After these four calculations the results of the equations (3) to (6) are known and the calculations for the next signal sample can be effected. It will be evident that the calculations represented in FIGS. 8a and 8b can be effected simultaneously and that then also the calculations represented in FIGS. 8c and 8d can be effected simultaneously, because totally independent signals are utilized for these respective calculations. Each of the processors 58 and 59 only needs to make two calculations during a sample interval instead of four calculations in case there is only one processor available for each double filter stage, so that processors having a slower speed can indeed be utilized.

The invention is not defined by the implementation in two-multiplier lattice filter stages shown in FIG. 1. It is also possible to use the invention in one-multiplier or four-multiplier lattice filter stages as shown in FIGS. 3 and 4 of the above article by A. H. Gray and J. D. Markel. For some of these other filter stages it will be briefly explained hereinbelow in what manner the invention can be implemented.

FIG. 9 shows a lattice filter stage having one multiplier 61 and three adder circuits 62, 63 and 64 and a delay stage 65. The following equations hold for the output signals e(i−1)(n) and d(i)(n):

$$e(i-1)(n)=e(i)(n)+K(i)[e(i)(n)-d(i-1)(n-1)] \quad (7)$$

$$d(i)(n)=K(i)[e(i)(n)-d(i-1)(n-1)]+d(i-1)(n-1) \quad (8)$$

Figure 2:
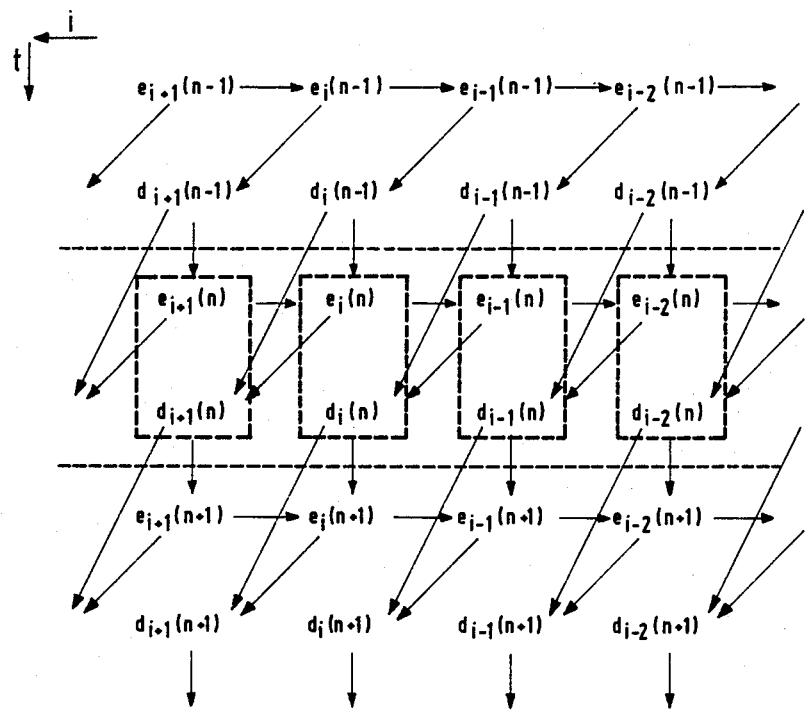
FIG. 2 shows a diagram representing the signal flow inside the filter shown in FIG. 1 as a function of place and time.

These equations can be represented in the manner explained with reference to FIG. 2 by the diagram shown in FIG. 9b. This diagram shows that is not simply possible to process the signals in parallel in the stages constituting the lattice filter shown in FIG. 9a, because, for example, e(i) does not only depend on the signal d(i) during a preceding sample interval, but also on the signal e(i+1) during the same sample interval. The diagram as shown in FIG. 9b, however, can be re-arranged into the diagram shown in FIG. 9c, from which it appears that e(i−1)(n) and d(i)(n) merely depend on the signals e(i)(n) and d(i+1)(n) during the same sample interval of the adjacent stage and for the rest only depend on signals which were calculated during the preceding sample intervals and are known, consequently, and can be read from a memory, for example. Thus, according to the invention, even numbers of these filter stages, two, for example, can always be combined into a double filter stage, whilst all double filter stages can be processed in parallel by their individual processors. Needless to observe, that also in the case of a filter having 2N stages there will be a maximum delay of N sample intervals between the input and the output.

Figure 9A:
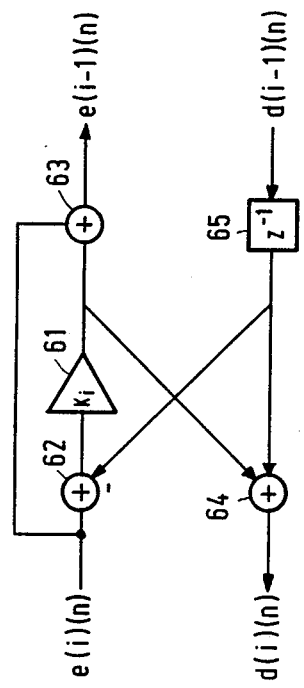
FIG. 9a shows a second configuration of a stage of a lattice filter.
Figure 9B:
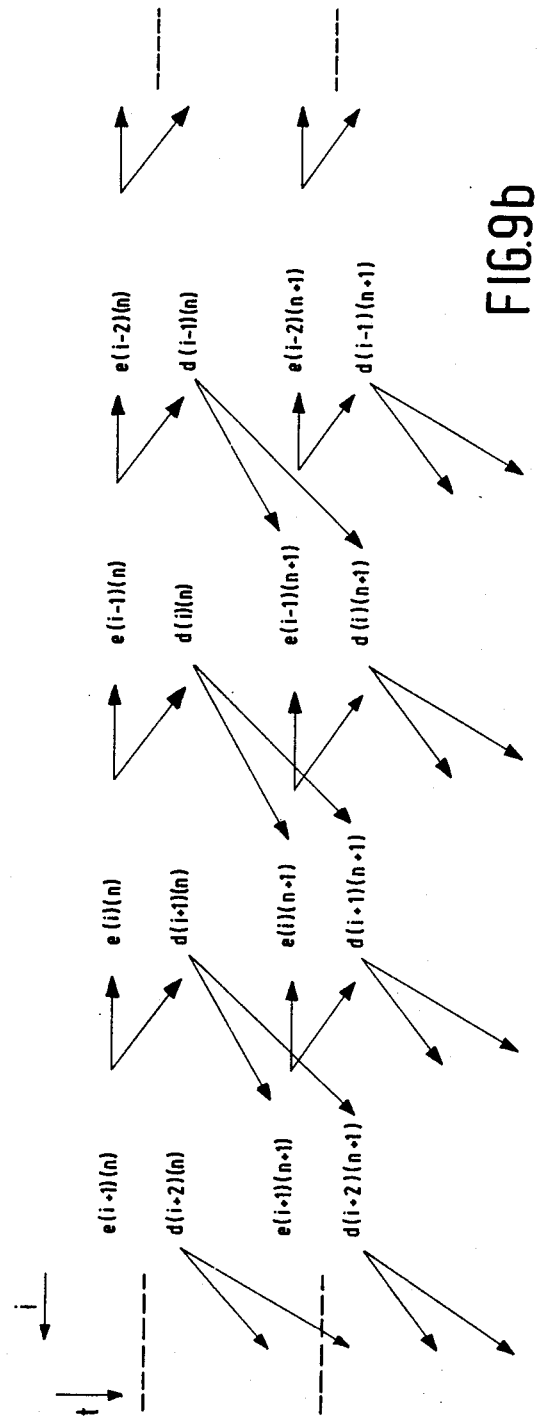
Figure 9C:
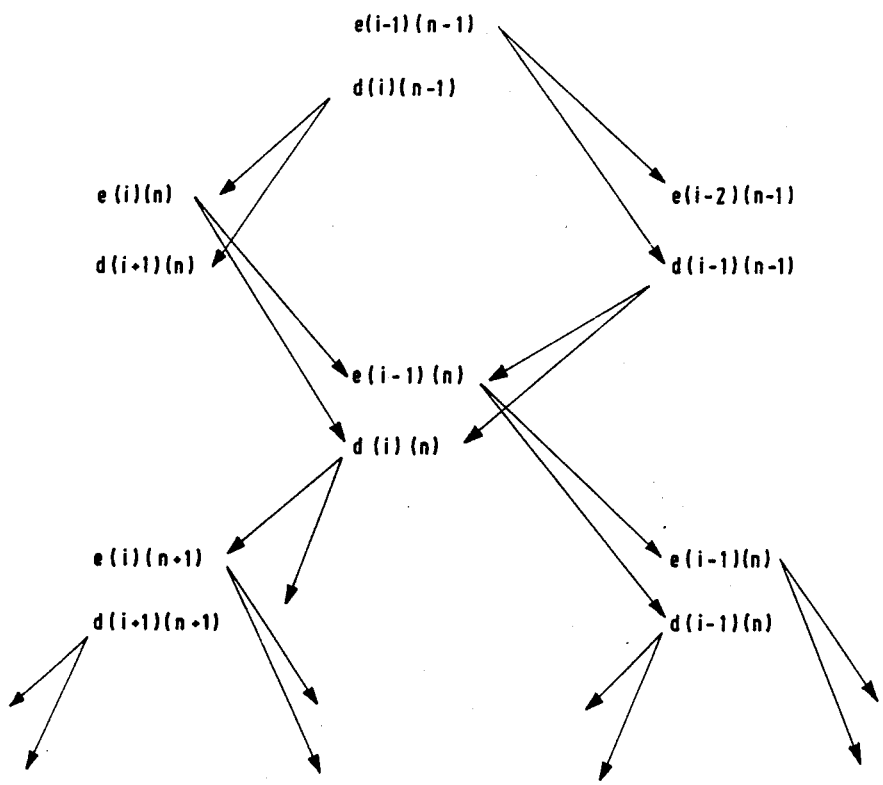
FIG. 9c shows a signal flow in the filter as a function of place and time as shown in FIG. 9a and represented in the same manner according to the invention.

The filter stages as shown in FIG. 9a can be combined in the same manner as shown in FIG. 4, by cascading the stages i+1 and i and displacing the delay element 65 from stage i to the top filter branch immediately coming after the input for the signal e(i+1)(n) of stage i+1.

Figure 10A:
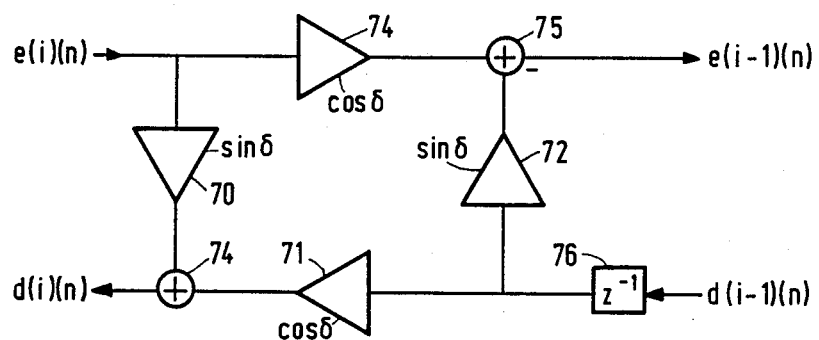
FIG. 10a shows a third configuration of a stage of a lattice filter.
Figure 10B:
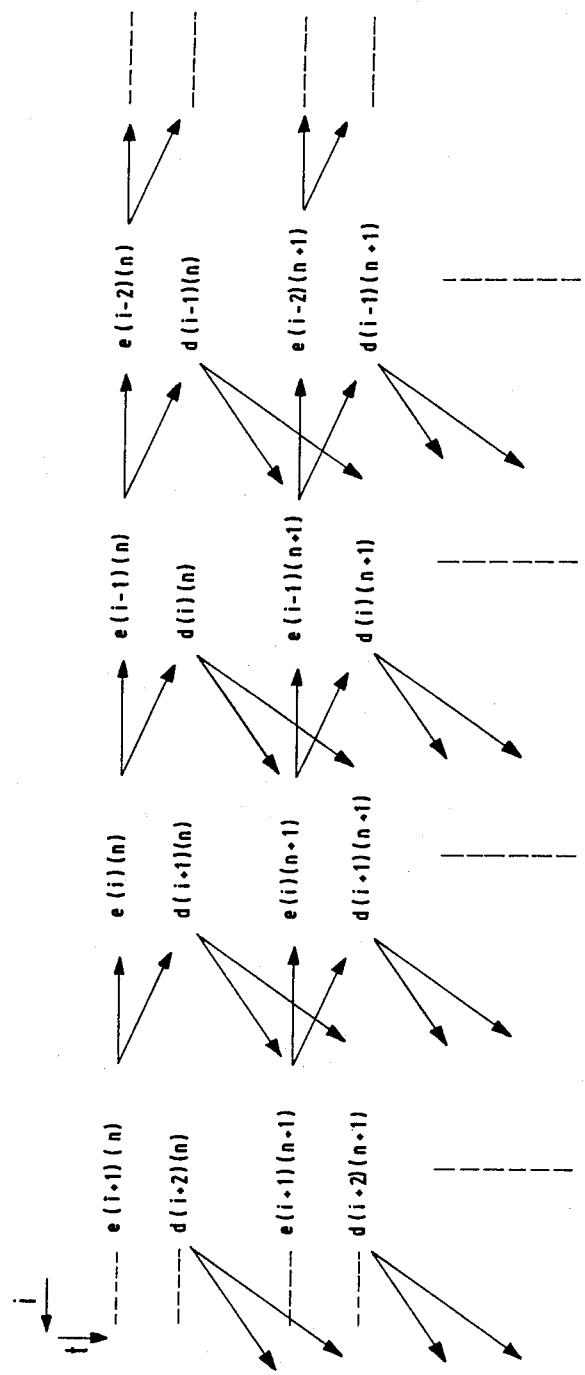
FIG. 10b shows the signal flow in the filter as shown in FIG. 10a as a function of place and time.
Figure 10C:
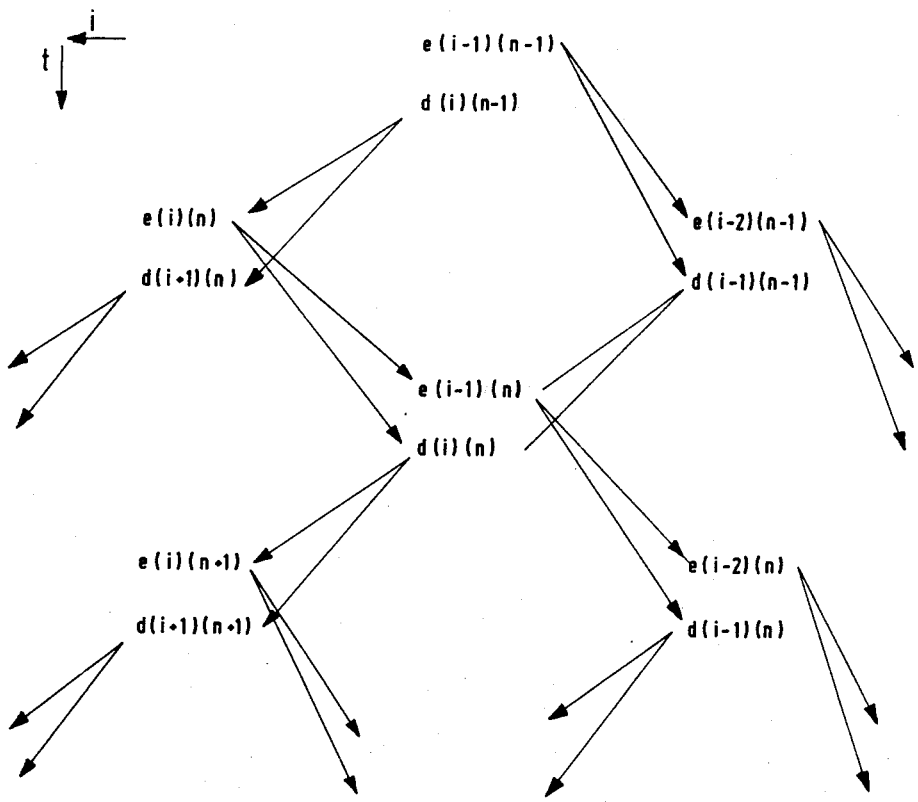
FIG. 10c shows a signal flow in the filter as shown in FIG. 10a as a function of place and time represented in the manner according to the invention.

FIG. 10 shows a lattice filter stage comprising four multipliers 70 to 73, two adders 74, 75 and a delay stage 76. For the output signals of this filter stage the following holds:

$$e(i-1)=\cos>(i).e(i)(n)-\sin>(i).d(i-1)(n-1) \quad (9)$$

$$d(i)(n)=\sin>(i).e(i)(n)+\cos>(i).d(i-1)(m-1) \quad (10)$$

These equations too can be represented by way of a diagram shown in FIG. 10b. When re-arranging this diagram e(i−1)(n) and d(i)(n) again appear to depend exclusively on the signals of one adjacent filter stage during the same sample interval and also on the signals from preceding sample intervals, which can be read from a memory. Thus, according to the invention, two of the filter stages represented in FIG. 10a, can also be combined into a double stage with one associated processing unit, in which all double stages operate in parallel and each have their own processing units.

Figure 11A:
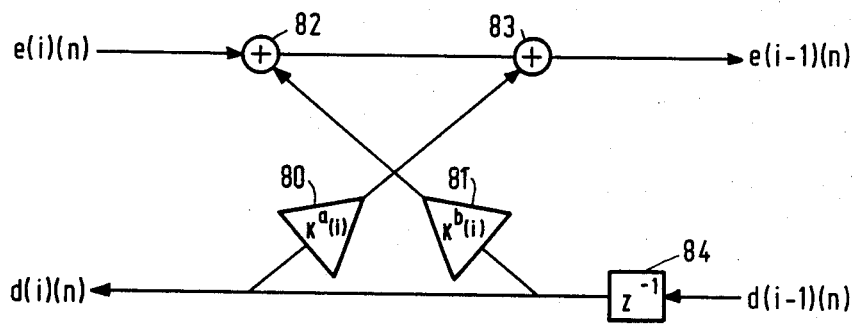
FIG. 11a shows a fourth configuration of a stage of a lattice filter.
Figure 11B:
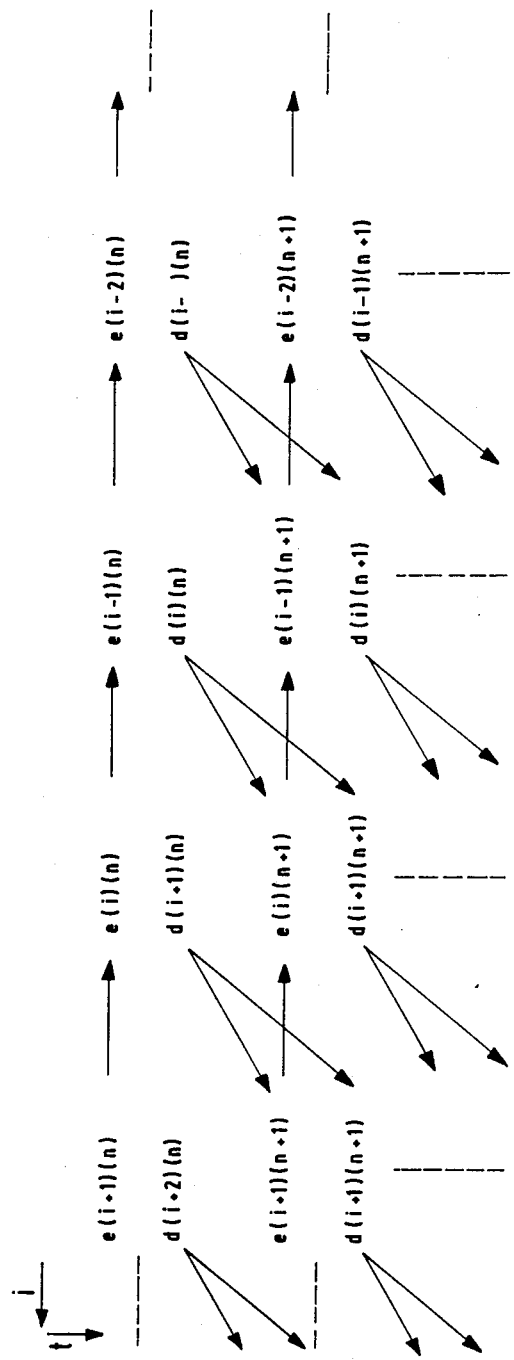
FIG. 11b shows the signal flow in the filter as shown in FIG. 11a as a function of place and time.

Finally, FIG. 11a shows a third variant of a lattice filter stage having two multipliers 80, 81 two adder circuits 82, 83 and a delay circuit 84. In a manner similar to the one represented in FIGS. 9 and 10 the diagram shown in FIG. 11b can be derived from the following equations:

$$e(i-1)(n)=e(i)(n)+d(i-1)(K^a(i)+K^b(i)) \quad (11)$$

$$d(i)(n)=d(i-1)(n-1) \quad (12)$$

Figure 11C:
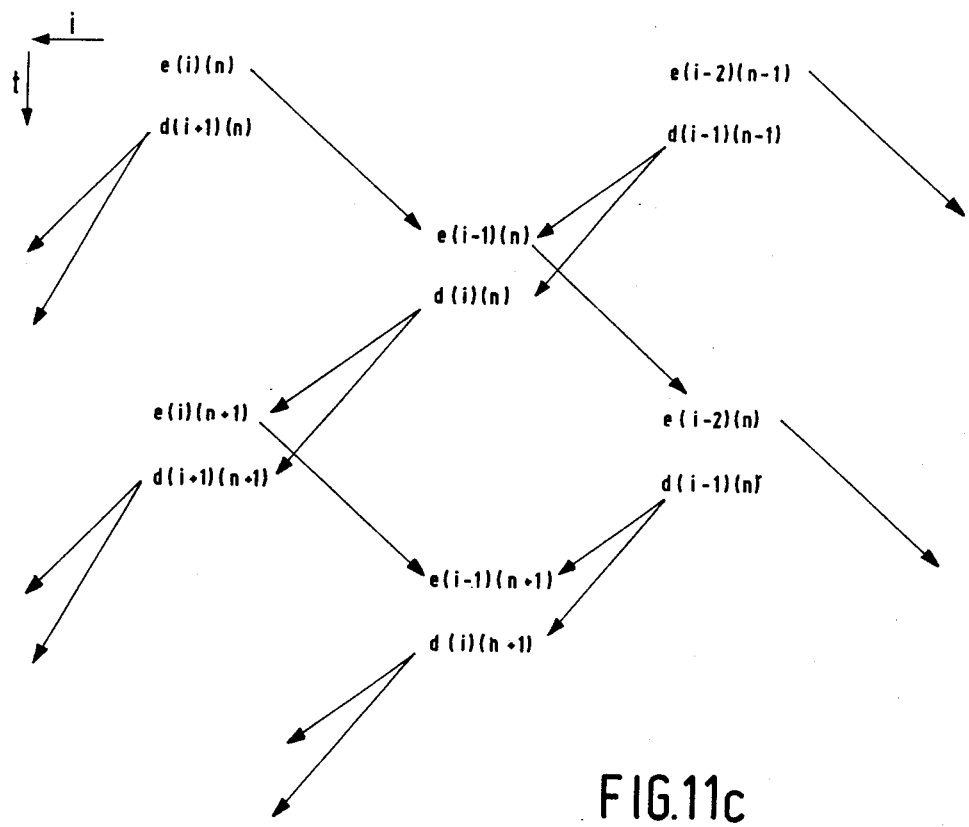
FIG. 11c shows a signal flow in the filter as shown in FIG. 11a represented in the manner according to the invention.

This diagram can be re-arranged into a diagram suitable for implementing the invention as appears from FIG. 11c.

Figure 12:
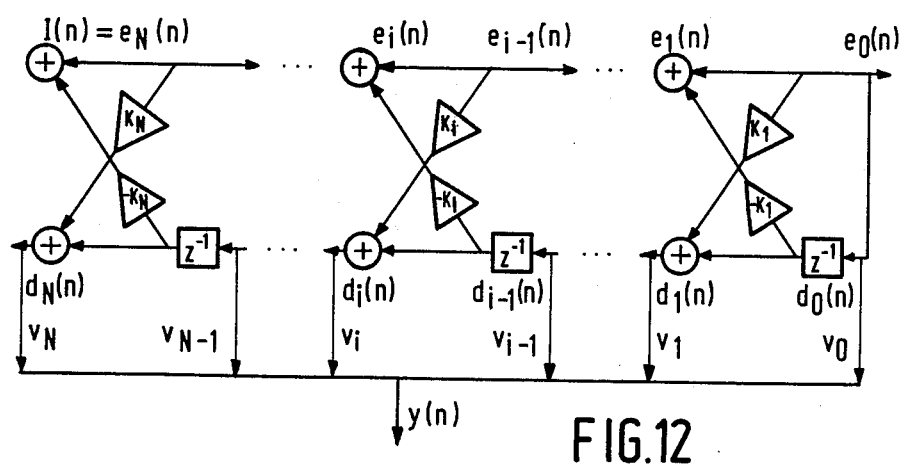
FIG. 12 shows a recursive lattice filter which is incorporated in a pole-zero filter configuration.

Finally, it should be observed that the implementation of the invention is not limited to all-pole recursive lattice filters, but can also be implemented in pole-zero filter structures, of which the configuration may have the form as, for example, shown in FIG. 12. Such a lattice filter in which the output signals d(i)(n) of all filter stages are always weighted and added together for constituting the output signal y(n) is known per se from the publication by D. Parikh, M. Ahmed and, S. D. Stearns, entitled: "An Adaptive Lattice Algorithm for Recursive Filters", IEEE Transactions on Acoustics, Speech and Signal Processing, Volume ASSP 28, No. 1, February 1980.

In such a filter the problem may also arise that a sample interval is too short for the available processor to run through the lattice filter sequentially, so that also in that case the invention can be used to advantage. However, it is problematic that for a calculation of y(n) all signals d(i)(n), with i=1 to 2N, of all filter stages have to be available at the instant n. For example, this implies that the signal d(2N)(n) of stage 2N has to be remembered for N sample intervals until also the signal d(1)(n) has been calculated, which is effected according to the basic idea of the invention with a maximum delay of N symbol intervals.

Figure 13:
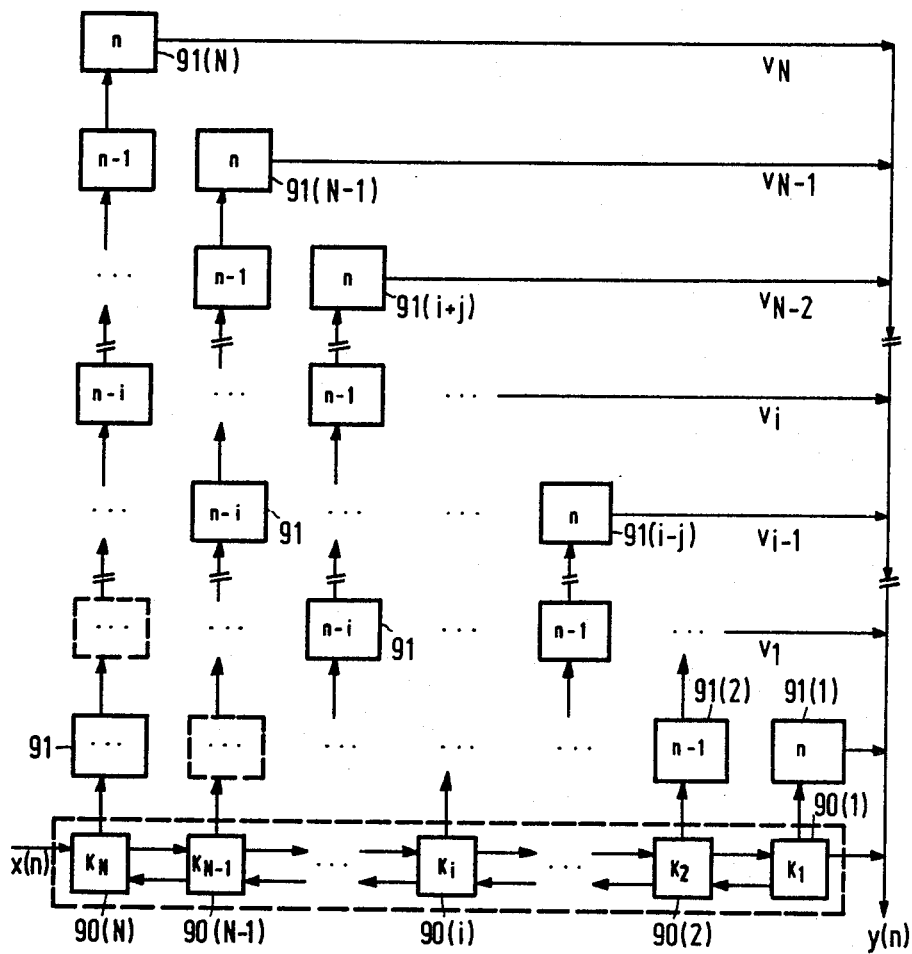
FIG. 13 shows the filter as shown in FIG. 12 in a configuration according to the invention.

In order to solve this problem, the configuration diagrammatically shown in FIG. 13 can be utilized, in which the double stages of the lattice filter according to the invention are shown as N single stages 90-1 to 90-N for clarity. Storing the output signals of the N double filter stages requires $N^2/2$ memory locations 91-1 to 91-N, which is distinctly shown in the diagram. The signal of stage N has to be remembered for N sample intervals as against the signal of stage 1 for only one interval. The weighted output signals u(N)-u(1) of always the last memory location 91 in each column are added and together yield the output signal y(n). This addition of N output signals always has to be effected within one sample interval too, but this does not usually cause any great problems even for large values of N.

A lattice filter which is constructed in the manner according to the invention can also be used as an adaptive filter. In such a case the coefficients are adjusted on the basis of output signals of the filter stages with the aid of a predetermined adaptive algorithm of the filter stages. This coefficient adjustment is effected on the basis of all output signals of the filter stages in a single sample interval, which means, as in the case of the filter shown in FIG. 13, that the output signal of stage N has to be remembered for N sample intervals again requiring a memory space of $N^2/2$ memory locations so that all output signals of the preceding filter stages 2-N are available as well at instant n when the output signal of stage 1 is available, in order to process these signals with the aid of the adaptive algorithm.

In a preferred embodiment of the lattice filter according to the invention, however, only N additional memory locations can suffice if the lattice filter is designed to be adaptive, in which case the coefficients are not adjusted every sample interval, but only every N sample intervals. For a single memory location will then be assigned to each pair of stages, whilst a signal originating from stage i will be retained in memory location i or i sample intervals, so that after N intervals the signals from the filter stages do occur in all memory locations at instant n. Alternatively it is possible to provide more than N memory locations and link each group to more than one memory, which memories are designed to store the output signals for a predetermined number of sample intervals whilst the coefficients are readjusted periodically after a possibly different number of sample intervals.

The readjustment of the filter coefficients, for example, only once per N intervals, turns out to be advantageous in practice, because then transitional phenomena occurring when adjusting the coefficients are in the position to die out before a coefficient is readjusted anew. Finally, owing to the structure of the lattice filter according to the invention, this filter can be modified to a direct form 1 filter. For according to the invention the internal structure of the filter is not affected. With respect to the filter shown in FIG. 4 the direct form 1 can be attained by reducing the coefficients $K^a$ to nill. An extensive discussion on the direct form 1 filter is given in C. R. Rabiner and B. Gold's "Theory and Application of Digital Signal Processing", Prentice Hall, 1974, p. 41.

Although the processing in parallel of a lattice filter having 2N filter stages has been explained above with reference to a double "conventional" filter stage, it is also feasible, basically, to combine another even number of adjacent conventional filter stages, thus for example 4 or 6 stages into a single group and process them collectively using a single processing unit containing at least one processor. When the groups do not comprise two filter stages but more than that and there are P groups (P<N) in lieu of N groups for a lattice filter having 2N stages, $P^2/2$ memory locations are required for this filter in lieu of $N^2/2$ memories as observed in the explanation of FIG. 13. In that case an adaptive lattice filter should be provided having no less than P memory locations. The number of filter stages need not necessarily be even either, as part of the filter stages can be grouped in the manner according to the invention and the remaining filter stages can be processed sequentially in a conventional way. Thus, in dependence on the sampling rate of the signals to be filtered and the speed of the processing units used, it is possible to choose an optimum number of processing units and thus realize an optimum price/performance ratio for each application.

What is claimed is:

1. A digital lattice filter, comprising a plurality of identical filter stages each having a pair of inputs for receiving input signals and a pair of outputs for supplying output signals, these stages being connected in a cascade arrangement, each stage consisting in no less than two mutually linked branches, no less than one of these branches comprising delay means, a number of successive cascaded filter stages, of the plurality of filter stages, forming a group, at least first and second branches in each group of filter stages comprising delay means such that the time delay in the first branch is equal to the time delay in the second branch, characterized in that each group comprises an even number of successive cascaded filter stages and in that each group comprises a single processing unit which calculates during a sample interval the two output signals on the basis of the two input signals, whilst the processing units of the successive groups calculate the output signals for different sample instants.

2. A digital lattice filter as claimed in claim 1, characterized in that the filter is comprised of a number of identical groups, each consisting of an even number of filter stages.

3. A digital lattice filter as claimed i claim 2, characterized in that the even number is equal to two.

4. A digital lattice filter as claimed in claim 3, characterized in that the different sample instants are successive sample instants.

5. A digital lattice filter is claimed in claim 4, characterized in that two processors are comprised in one processing unit, each of the processors calculating one output signal during the sample interval.

6. A digital lattice filter as claimed in claim 4, characterized in that the first branch of the group comprises in a series arrangement between the first input and the first output a first delay circuit, for delaying the first input signal over one sample interval, a first adder circuit and a second adder circuit; in that the second branch comprises in a series arrangement between the second input and the second output a third adder circuit, a second delay circuit, for delaying the second input signal over one sample interval, and a fourth adder circuit; in that the output signal of the second delay circuit multiplied by a first coefficient is added to the delayed first input signal; in that the output signal of the first adder circuit multiplied by a second coefficient is added to the output signal of the second delay circuit; in that the second input signal, multiplied by a third coefficient is added to the output signal of the first adder circuit, and in that the output signal of the second adder circuit multiplied by a fourth coefficient is added to the second input signal.

7. A digital lattice filter as claimed in claim 1, characterized in that the lattice filter comprises P groups of filter stages and in that $P^2/2$ memories are provided and in that each group of filter stages $i(1 \leq i \leq P)$ is connected to the input of a series arrangement of i memories, whilst the successive memories in the series arrangement are designed to store the output signals of a group at successive sample instants and that means are provided for adding the signals stored in the last memory of each series arrangement of memories to the output signal of the last group (1) of the lattice filter.

8. A digital lattice filter as claimed in claim 1, characterized in that the lattice filter comprises P groups of filter stages and in that no less than P memories are provided, each group being connected to a memory arranged to store the output signals of the associated group for a predetermined number of sample intervals, and in that means are provided for adaptively adjusting after a second predetermined number of sample intervals the coefficients of the groups on the basis of the signal values stored in the locations.

9. A digital lattice filter as claimed in claim 8, characterized in that the number of groups of filter stages and the number of memories is equal to N, each group being coupled to one memory designed to store the output signals of the associated group $i(1 \leq i \leq N)$ for i sample intervals and in that the coefficients are adjusted after N sample intervals.

* * * * *